United States Patent
Bossmeyer et al.

(10) Patent No.: US 7,302,459 B2
(45) Date of Patent: Nov. 27, 2007

(54) METHOD AND APPARATUS FOR DIGITAL SAMPLE RATE CONVERSION

(75) Inventors: Thomas Bossmeyer, Korntal-Münchingen (DE); Christian Krönke, Munich (DE); Detlef Müller, Renningen (DE)

(73) Assignee: LSI Corporation, Milpitas, CA (US)

( * ) Notice: Subject to any disclaimer, the term of this patent is extended or adjusted under 35 U.S.C. 154(b) by 741 days.

(21) Appl. No.: 10/725,727

(22) Filed: Dec. 2, 2003

(65) Prior Publication Data

US 2004/0148319 A1 Jul. 29, 2004

Related U.S. Application Data

(60) Provisional application No. 60/441,927, filed on Jan. 21, 2003.

(51) Int. Cl.
*G06F 17/17* (2006.01)
(52) U.S. Cl. ..................................... 708/313
(58) Field of Classification Search ............... 708/313; 341/61
See application file for complete search history.

(56) References Cited

U.S. PATENT DOCUMENTS

| | | | |
|---|---|---|---|
| 6,496,546 B1 * | 12/2002 | Allpress et al. | 375/316 |
| 7,061,409 B1 * | 6/2006 | Jantti et al. | 341/61 |
| 2003/0187894 A1 * | 10/2003 | Wang | 708/313 |
| 2004/0107078 A1 * | 6/2004 | Chiu et al. | 703/2 |

OTHER PUBLICATIONS

Floyd M. Gardner, "Interpolation in Digital Modems—Part I: Fundamentals", IEEE Transactions on Communications, vol. 41, No. 3, Mar. 1993, pp. 501-507.
Lars Erup et al., "Interpolation in Digital Modems—Part II: Implementation and Performance", IEEE Transactions on Communications, vol. 41, No. 6, Jun. 1993, pp. 998-1008.
Eugene B. Hogenauer, "An Economical Class of Digital Filters for Decimation and Interpolation", IEEE Transactions on Acoustics, Speech, and Signal Processing, vol. ASSP-29, No. 2, Apr. 1981, pp. 155-162.
Tim Hentschel et al., "Sample Rate Conversion for Software Radio", IEEE Communications Magazine, Aug. 2000, pp. 142-150.

* cited by examiner

*Primary Examiner*—Tan V. Mai
(74) *Attorney, Agent, or Firm*—Christopher P Maiorana

(57) ABSTRACT

The present invention may relate generally to a circuit for converting a first digital signal having a first sample rate to second digital signal having a second sample rate. The circuit may comprise a cascaded integration-comb filter and a fractional sample rate converter. The fractional sample rate converter may be configured to perform fractional sample rate conversion. A first of the cascaded integrator-comb filter and the fractional sample rate converter may be configured to receive the first signal having the first sample rate and to generate a third digital signal having a third sample rate different from the first and second sample rates. A second of the cascaded integrator-comb filter and the fractional sample rate converter may be configured to receive the third signal having the third sample rate and to generate the second signal having the second sample rate.

20 Claims, 6 Drawing Sheets

METHOD AND APPARATUS FOR DIGITAL SAMPLE RATE CONVERSION

This application claims the benefit of U.S. Provisional Application No. 60/441,927 filed Jan. 21, 2003 which is hereby incorporated by reference in its entirety.

FIELD OF THE INVENTION

The present invention may relate to sample rate conversion of a digitized signal. The invention may be suitable for up-sampling to a higher sampling rate and/or down-sampling to a lower sampling rate. The invention may be especially suitable for a high, non-integer conversion ratio between an initial sampling rate and a target sampling rate. The invention may be especially suitable for incorporation within an integrated circuit.

BACKGROUND TO THE INVENTION

One conventional technique for sample rate conversion uses finite impulse response (FIR) filters or infinite impulse response (IIR) filters to perform the sample rate conversion. However, such circuits are complicated, and involve a large number of circuit elements, such as logic gates. The circuit complexity increases for a high sample rate conversion ratio. The circuit complexity additionally increases to maintain low distortion of a high quality digitized signal. In an integrated circuit implementation, such complicated filters occupy an undesirably large area of the die, and power consumption is undesirably high. Moreover, the quality of the digitized signal is very often difficult to maintain in practice.

An alternative conventional technique employs a cascaded integrator-comb (CIC) filter. However, such a technique is efficient only for integer sample rate conversion ratios. Such a limitation vastly reduces the usefulness of a CIC filter for many sample rate conversion circuit applications that involve non-integer sample rate conversion ratios.

SUMMARY OF THE INVENTION

The present invention may relate generally to a circuit for converting a first digital signal having a first sample rate to second digital signal having a second sample rate. The circuit may comprise a cascaded integration-comb filter and a fractional sample rate converter. The fractional sample rate converter may be configured to perform fractional sample rate conversion. A first of the cascaded integrator-comb filter and the fractional sample rate converter may be configured to receive the first signal having the first sample rate and to generate a third digital signal having a third sample rate different from the first and second sample rates. A second of the cascaded integrator-comb filter and the fractional sample rate converter may be configured to receive the third signal having the third sample rate and to generate the second signal having the second sample rate.

Advantages, features and objects of the invention may include one or more of: (i) enabling a cascaded integrator-comb filter to be used in a circuit for non-integer ratio conversion of a sampling rate; (ii) providing an efficient circuit that is able to perform high, non-integer ratio conversion of a sampling rate; (iii) enabling significant reduction in die area occupied by a sample rate conversion circuit; and/or (iv) enabling significant reduction in power consumption of a sample rate conversion circuit. Other features, objects and advantages of the invention will become apparent from the following description, claims and/or drawings.

BRIEF DESCRIPTION OF THE DRAWINGS

Non-limiting preferred embodiments of the invention are now described, by way of example only, with reference to the appended claims and drawings, in which:

DETAILED DESCRIPTION OF THE PREFERRED EMBODIMENTS

Figure 1:
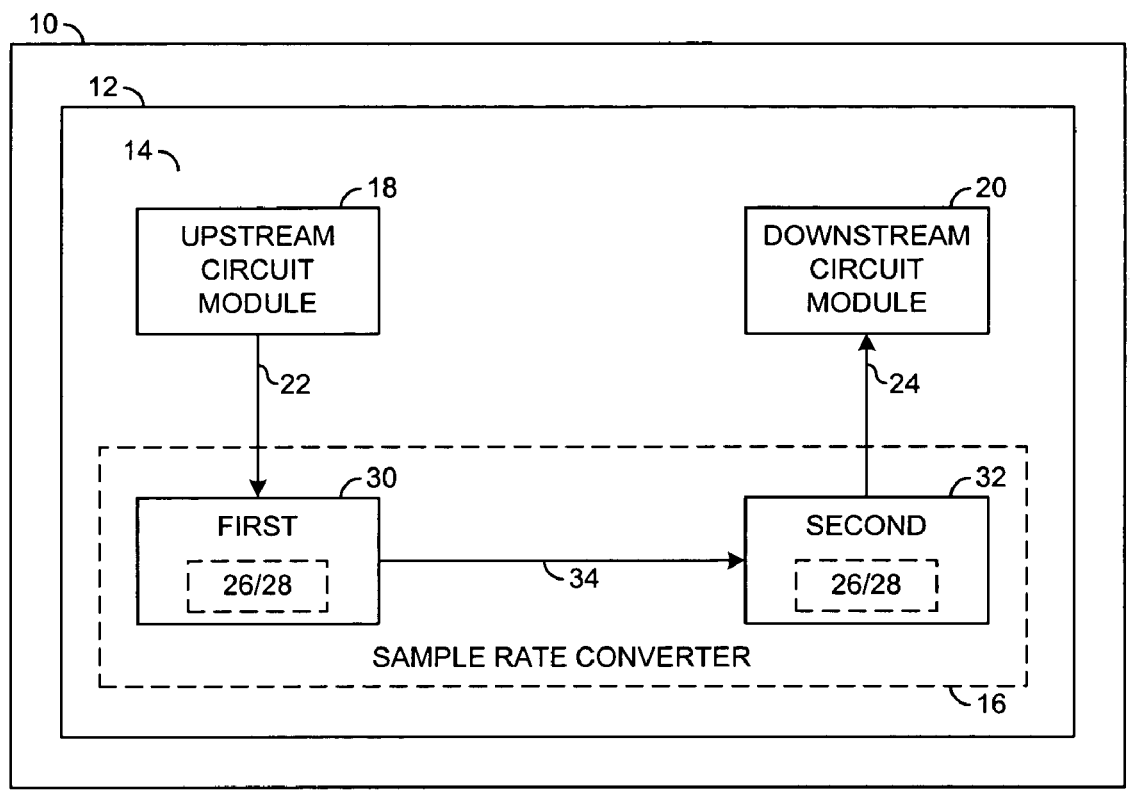
FIG. 1 is a schematic block diagram of an integrated circuit in a first embodiment of the invention.

In the drawings, the same reference numerals may be used to denote equivalent features of the different embodiments, without any limiting effect.

Referring to FIG. 1, an integrated circuit 10 may comprise a die 12 carrying a circuit 14. The integrated circuit 10 may, for example, be an Application Specific Integrated Circuit (ASIC), or a programmable Digital Signal Processor (DSP), or programmable logic such as a Field Programmable Gate Array (FPGA). The circuit 14 may include a sample rate converter 16. The sample rate converter 16 may be implemented substantially or entirely as a digital circuit. The sample rate converter 16 may be coupled between an upstream circuit module 18 and a downstream circuit module 20. The circuit 14 may additionally comprise other circuit modules (not shown). The circuit 14 may be any circuit that involves sample rate conversion between two circuit modules 18 and 20. The circuit modules 18 and 20 may process the digitized signals at different sampling rates selected for those modules. Alternatively, the circuit 14 may convert a digitized signal from one signal format to another. For example, one of the circuit modules 18 and 20 may comprise a modulator or a demodulator.

The sample rate converter 16 may be configured to receive a first digitized signal 22 at a first sample rate (e.g., $F_{s1}$) from the upstream circuit module 18. The sample rate converter 16 may be further configured to generate a second digitized signal 24 at a second sample rate (e.g., $F_{s2}$), for feeding to the downstream circuit module 20. The ratio of one sample rate relative to the other may be high, for example, greater than 50, or greater than 100. The ratio of one sample rate relative to the other may be a fractional ratio. The term fractional ratio may refer to a ratio that is not an integer ratio. The term integer ratio may refer to a ratio that is an integer or 1 divided by an integer.

The sample rate converter 16 may generally comprise a fractional interpolator (FI) 26 and a cascaded integrator-comb (CIC) filter 28. The CIC filter 28 may be configured for converting a sample rate by an integer ratio (e.g., $R_{CIC}$). The fractional interpolator 26 may be configured for providing an additional sample rate conversion by a fractional ratio (e.g., $R_{FI}$). The ratio $R_{CIC}$ may be larger than the ratio $R_{FI}$, for example, by a factor of ten or more. The ratio $R_{CIC}$ may be at least 100. The ratio $R_{FI}$ may be at least 5, or at least 9, or at least 10. A combination of the fractional interpolator 26 and the CIC filter 28 can enable many of the efficiencies and advantages associated with the CIC filter 28 to be extended to sample rate conversion at a fractional ratio. Using a ratio $R_{CIC}$ that is larger than the ratio $R_{FI}$ may enable the fractional interpolator to have a relatively low complexity and speed and/or enable the sample rate converter 16 to be implemented extremely efficiently and with low power consumption. Using a high ratio $R_{CIC}$ may also provide a high quality signal from the CIC filter 28. A high ratio $R_{CIC}$ may yield a low signal distortion and/or a high stopband attenuation.

The respective order of the fractional interpolator 26 and the CIC filter 28 in the sample rate converter 16 may depend on a particular circuit application. A first 30 of either the fractional interpolator 26 or the CIC filter 28 may be coupled to receive the first digitized signal 22, and to generate therefrom a third digitized signal 34 having a third sample rate (e.g., $F_{s3}$). A second 32 of either the fractional interpolator 26 or the CIC filter 28 may be coupled to receive the third digitized signal 34 and to generate therefrom the second digitized signal 24. The third sample rate may be intermediate the first and second sample rates. When the second sample rate is higher than the first sample rate (e.g., up-conversion), the first circuit 30 may be the fractional interpolator 26, and the second circuit 32 may be the CIC filter 28. When the second sample rate is lower than the first sample rate (e.g., down-conversion), the first circuit 30 may be the CIC filter 28, and the second circuit 32 may be the fractional interpolator 26. In either case, such an implementation may associate the fractional interpolator 26 with the lower of the first and second sample rates (e.g., the fractional interpolator 26 may receive, or generate, the lower of the first and second sample rates). Associating the fractional interpolator 26 with the lower of the first and second sample rates may enable the complexity and power consumption of the fractional interpolator 26 to be reduced.

Figure 2:
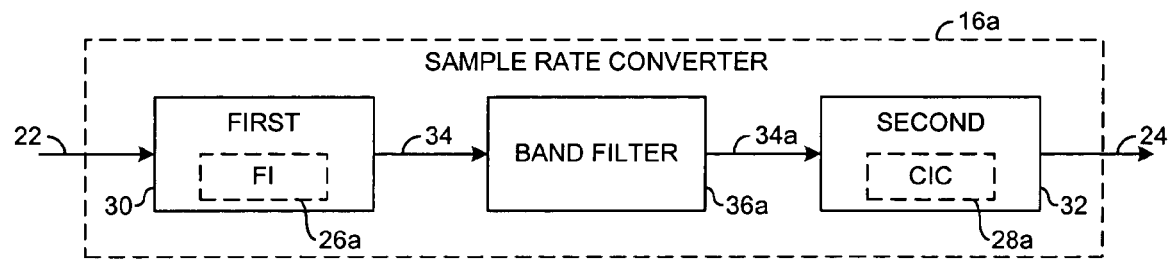
FIG. 2 is a schematic block diagram of a sample-rate up-converter of a second embodiment.

Referring to FIG. 2, the second embodiment may illustrate a more detailed example of a sample-rate converter 16a used for up-conversion. The first circuit 30 may be a fractional interpolator 26a. The second circuit 32 may be a CIC filter 28a. A band-limiting filter 36a may be coupled between the fractional interpolator 26a and the CIC filter 28a.

Figure 3:
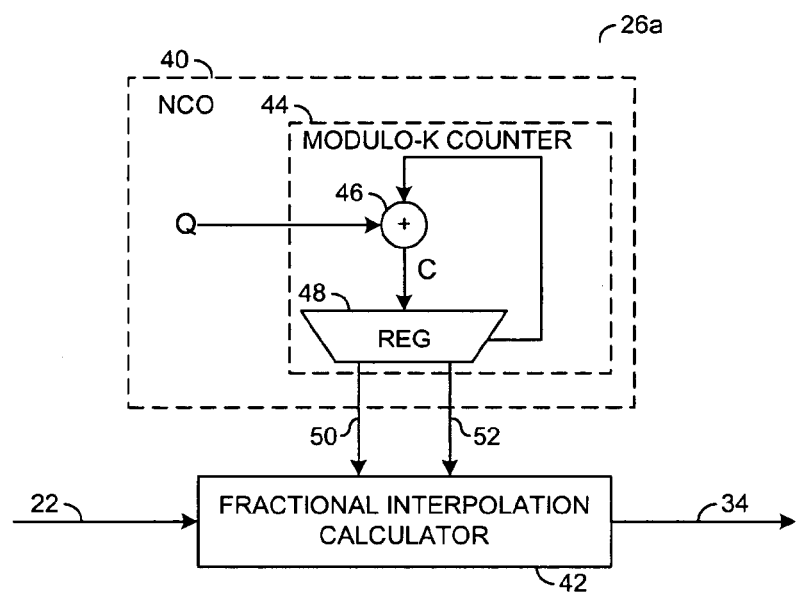
FIG. 3 is a schematic block diagram of the fractional interpolator of the second embodiment.

Referring to FIG. 3, the fractional interpolator 26a may generally comprise a numeric controlled oscillator (NCO) 40, and a fractional interpolation calculator 42. The NCO 40 may comprise a modulo-K counter 44. The modulo-K counter 44 may comprise an adder 46 and a modulo-K register 48. The modulo-K counter 44 may be clocked at the third sample rate, and be configured to repetitively add an increment value (e.g., Q) to a count value (e.g., C) stored in the modulo-K register 48. When the count value C stored in the modulo-K register 48 may reach or exceed a threshold (e.g., K), the modulo-K counter 44 may generate a "full cycle" signal 50 and a "remainder" signal 52. The remainder signal 52 may correspond to a value (e.g., R) remaining after the threshold K may be subtracted from the count value C, for implementing the modulo-K function.

Figure 4:
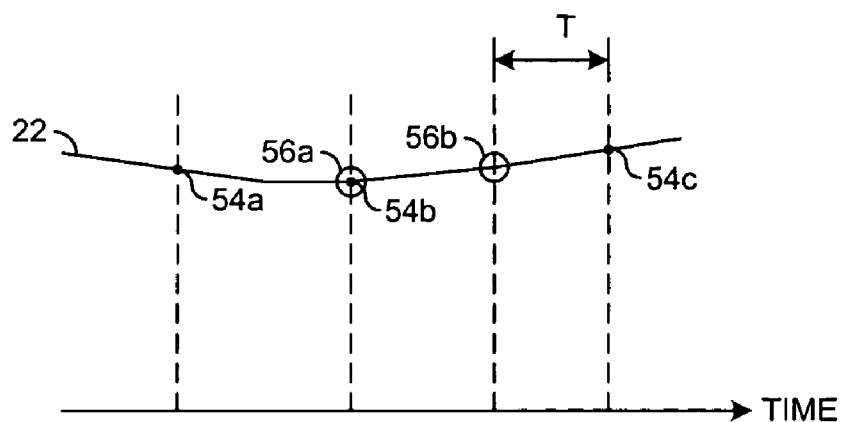
FIG. 4 is a schematic graphical representation illustrating fractional interpolation.
Figure 5:
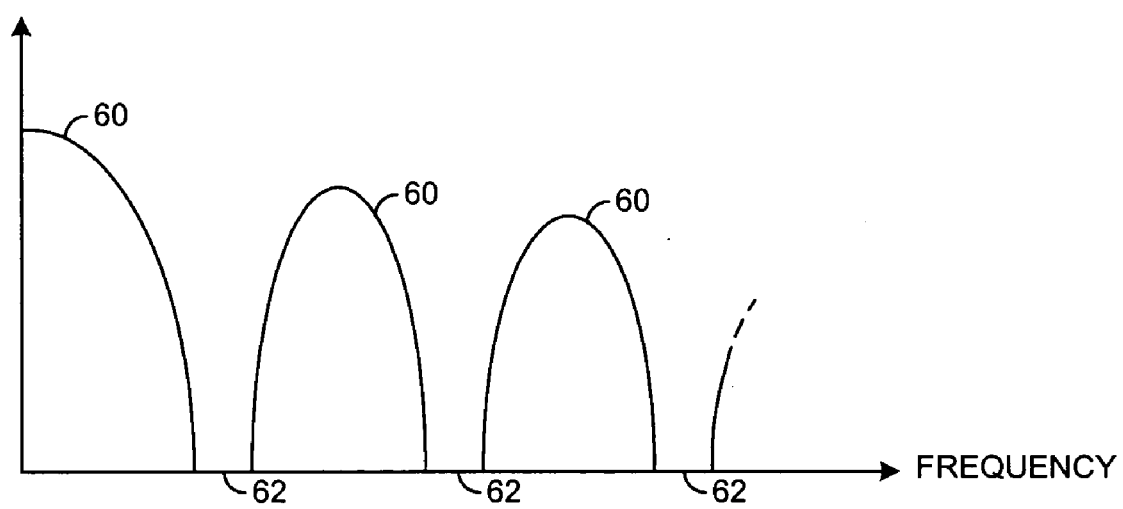
FIG. 5 is a schematic representation of a frequency response of the cascaded integrator-comb filter of the second embodiment.

The full cycle signal 50 and the remainder signal 52 may be fed as control signals to the fractional interpolation calculator 42. FIG. 4 may illustrate the principles of fractional interpolation using the signals 50 and 52. In FIG. 4, points 54 (e.g., 54a, 54b and 54c) may represent samples of the first signal 22 at the first sample rate. Points 56 (e.g., 56a and 56b) may represent samples to be interpolated from the points 54, to generate the third signal 34 at the third sample rate. As mentioned above, the third sample rate may be higher than the first sample rate, such that the points 56 may be closer together in time than the points 54. Referring to FIGS. 4 and 5, the full cycle signal 52 may indicate a timing for the fractional interpolation calculator 42 to read in a next sample 54 of the first signal 22. The remainder signal 52 may indicate a measure of the relative position T of a point to be interpolated between two consecutive samples 54 of the first signal 22, to generate a sample 56 at the third sample rate. When the remainder signal may be zero, the sample position 56a may be the same as the sample position 54b in the first signal 22. When the remainder may be non-zero, a deviation T between an actual sampling position 54c and the sampling position 56b to be interpolated may be indicated by $T = R/(K F_{s1})$. The ratio $R_{FI}$ may be indicated by $R_{FI} = K/Q$. The value of the remainder r may be between zero and K-1, inclusive.

Various calculation techniques may be used to perform the fractional interpolation calculation based on the deviation T. One example may be interpolation based on Lagrange polynomials. Lagrange polynomial interpolation may be described in more detail in F. M. Gardner, "Interpolation in digital modems—Parts I and II, IEEE Transactions Communications Vol. 41, nos. 3 and 6, March 1993 and June 1993. The contents of these articles are herein incorporated by reference in their entirety. A degree of the polynomial may be chosen in accordance with an acceptable interpolation error. A lower degree of polynomial may increase the interpolation error. A simple interpolation may be a linear interpolation constituting a first degree polynomial. Typically, cubic (e.g., third degree) or quintic (e.g., fifth degree) polynomial interpolation may provide sufficient performance. The polynomial may be of odd degree. The coefficients for the polynomial may be pre-computed and stored in a memory (not shown) of the fractional interpolation calculator 42, or the fractional interpolation calculator 42 may include circuitry (not shown) for generating the coefficients "on the fly" as needed.

A function of the band-limiting filter 36a may be to limit the bandwidth of the third signal 34. The bandwidth may be limited to not greater than half of the first sample rate. The maximum frequency of interest in the first signal 22 may be half the first sample rate, and so any higher frequency components existing in the third signal 34 may represent distortion. Moreover, referring to FIG. 5, the frequency response of the CIC filter 28a may typically include peaks 60 separated by nulls 62. Imaging may occur in the regions of the nulls 62. Limiting the bandwidth of the third signal 34 in a filtered third signal 34a may at least reduce, or avoid, such imaging in the CIC filter 28a.

The band-limiting filter 36a may, for example, be a recursive IIR or non-recursive FIR filter. An appropriate filter for an intended circuit application may depend on one or more of: circuit complexity; stability; and/or group and amplitude distortions. An FIR filter may be preferred for certain applications due to its inherent stability and its constant group delay. However, an IIR filter may be perfectly adequate for many circuit applications.

Figure 6:
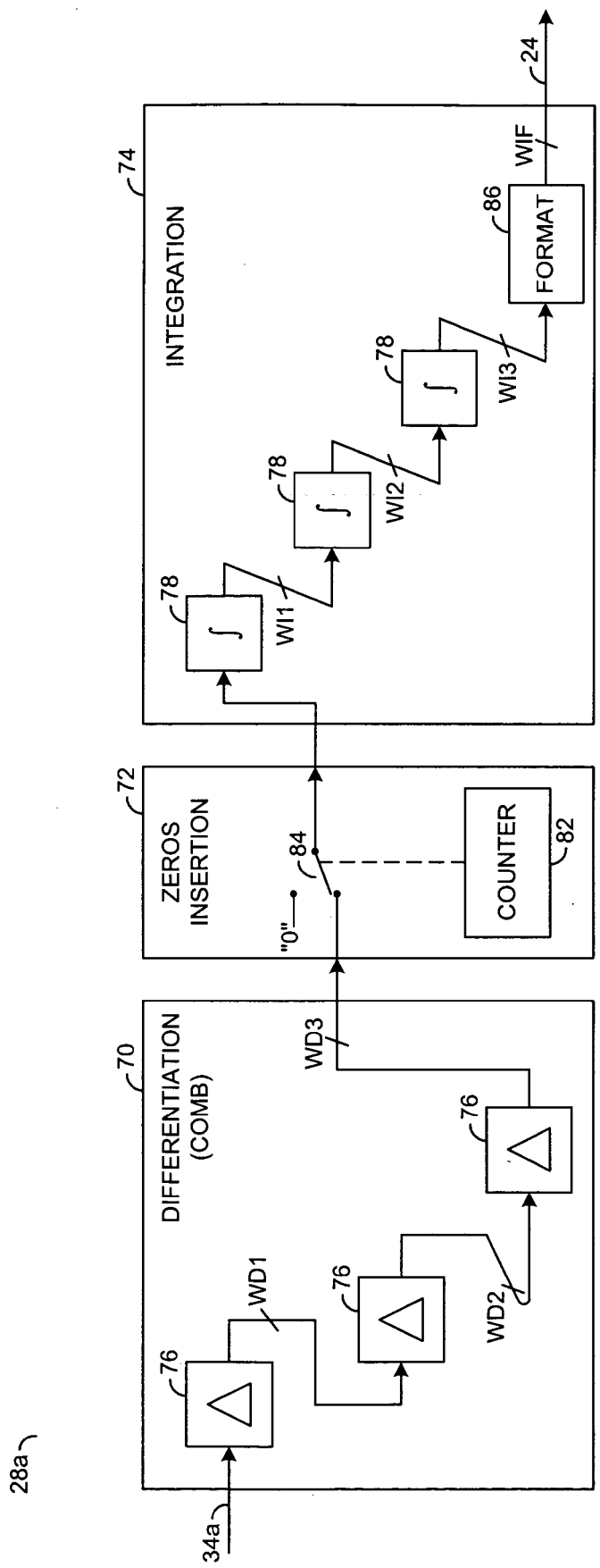
FIG. 6 is a schematic block diagram of the cascaded integrator-comb filter of the second embodiment.

Referring to FIG. 6, the CIC filter 28a for upsampling may generally comprise a differentiation section 70, a zeros insertion section 72, and an integration section 74. As explained below, the zeros insertion section may constitute a sample-number adjusting section for adjusting the number of digital samples. The differentiation section 70 may also be referred to as a comb section. The differentiation section 70 may comprise N differentiator stages 76. The integration section 74 may comprise N integrator stages 78.

Figure 7:
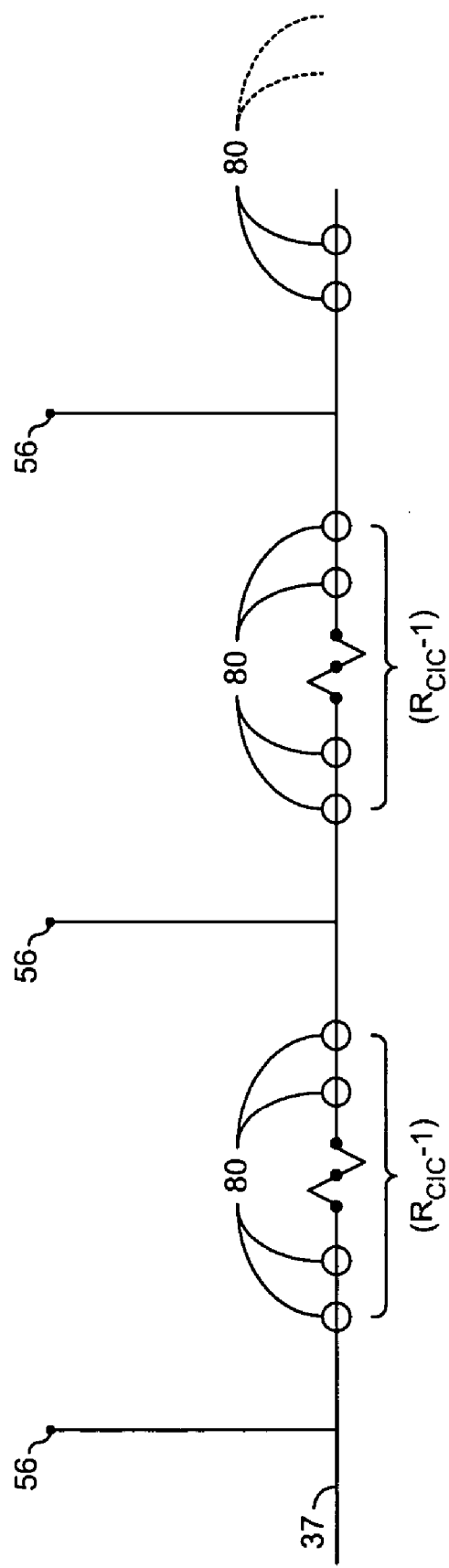
FIG. 7 is a schematic graphical representation illustrating zeros insertion in the cascaded integrator-comb filter of the second embodiment.

The value N may be an integer greater than zero, or greater than one, or greater than two. The differentiation section 70 may operate at the third sample rate. The integration section 74 may operate at the second sample rate. Referring to FIGS. 6 and 7, the zeros insertion section 72 may function to insert additional zero value samples 80 between actual samples 56 of the differentiated third signal 35, to increase the overall number of samples to match the second sample rate. The zeros insertion section 72 may comprise a modulo counter 82 and a switch 84. The modulo counter 82 may control the switch 84 when to insert a zero (at the points 80), and when to pass a sample of the differentiated third signal 35 (at the points 56) to generate a signal 37. The number of zero samples 80 inserted between two sample points 56 of the differentiated third signal 35 may be equal to $R_{CIC}-1$. Further information about CIC filter techniques may be found from E. B. Hogenauer, "An Economical Class of Digital Filters for Decimation and Interpolation", IEEE Transactions on Acoustics, Speech, Signal Processing, vol. ASSP-29, no. 2, April 1981. The contents of this article are herein incorporated by reference in its entirety.

Each differentiator stage 76 and each integrator stage 78 may be a first-order section, with coefficients of +1 or −1. Each differentiator stage 76 may be a first order transversal (e.g., FIR) filter. Each integrator stage 78 may be a purely recursive first order filter (e.g. IIR filter). The differentiator stages 76 and the integrator stages 78 may be implemented extremely efficiently, because there may be no coefficients other than +1 or −1. Therefore, the stages 76 and 78 may be implemented without multipliers, and/or without circuitry for generating or looking up coefficients. The CIC filter 28a may therefore be a relatively compact circuit that occupies a relatively small area of the die. One or more portions of the CIC filter 28a may be operated at a high sample rate, without significant power consumption.

The signal quality in the CIC filter 28a may be affected by one or more of: the data width of the digital samples (e.g., the resolution of the digital samples); an internal data width WD1, WD2, WD3, WI1, WI2, WI3 (e.g., resolution) associated with the differentiation section 70 and the integration section 74; the number N of differentiator stages 76 and integrator stages 78; and/or the ratio $R_{CIC}$. The internal data width may also depend on the ratio $R_{CIC}$. A high ratio $R_{CIC}$ may be associated with a larger data width because more significant bits of the digital samples may be used in the calculations. The number N may also depend on the internal data width because more significant bits of the digital samples may be used in the calculations. The integration section 74 may further comprise a data formatter 86 for obtaining a signal of interest from the output of the last integrator stage 78. The internal data width WI3 from the last integrator stage 78 may be wider than a data width WIF intended for the second signal 24. The data formatter 86 may extract the signal of interest, and format the signal among the data width WIF of the second signal 24.

The following tables may illustrate specific implementation details for a high quality sample rate up-converter 16a of the second embodiment suitable for use in digital broadcasting. The sample rate up-converter 16a may, for example, be configured to convert the sample rate of a digital audio signal for modulation as a television signal. The sample rate up-converter 16a may be configured to accept the first signal 22 at any one of six possible first sample rates between 16 KHz and 48 KHz (generally less than 100 KHz), and to generate the second signal 24 at a standard second sample rate of 27 MHz (generally above 10 MHz). For high quality broadcasting, the sample rate up-converter 16a may have a signal to noise ratio of 40 dB.

Table 1 may illustrate the relationships between the first sample rate, the third sample rate, the increment Q and the threshold K for the NCO 40:

TABLE 1

| First Sample Rate $F_{s1}$ (KHz) | Third Sample Rate $F_{s3}$ (KHz) | Ratio $R_{FI}$ | Increment Q | Threshold K |
|---|---|---|---|---|
| 16 | 75.0 | 75:15 | 16 | 75 |
| 22.05 | 112.5 | 250:49 | 49 | 250 |
| 24 | 112.5 | 75:16 | 16 | 75 |
| 32 | 150.0 | 75:16 | 16 | 75 |
| 44.1 | 225.0 | 250:49 | 49 | 250 |
| 48 | 225.0 | 75:16 | 16 | 75 |

The above selection of the third sample rates may result in only two different values of $R_{FI}$ being used, either 75:16 or 250:49. The increment Q and the threshold K may be programmable or selectable to implement the two different $R_{FI}$ ratios.

For high quality interpolation with a high signal to noise ratio (SNR), the fractional interpolation calculator 42 may use a quintic polynomial. Cubic interpolation may be used instead, but may reduce the SNR by up to 3 dB compared to quintic interpolation.

A set of interpolator coefficients $v_T$ may be computed from the Lagrange formulas for each value of $R_{FI}$:

$$u = \frac{1}{K} \cdot v_T = \begin{vmatrix} \frac{u}{30} \mid \frac{u^3}{24} + \frac{u^5}{120} \\ \mid \frac{u}{4} \mid \frac{u^2}{24} + \frac{7u^3}{24} + \frac{u^4}{24} \mid \frac{u^5}{24} \\ u + \frac{2u^2}{3} \mid \frac{7u^3}{12} \mid \frac{u^4}{6} + \frac{u^5}{12} \\ 1 \mid \frac{u}{3} \mid \frac{5u^2}{4} + \frac{5u^3}{12} + \frac{u^4}{4} \mid \frac{u^5}{12} \\ \mid \frac{u}{20} + \frac{2u^2}{3} \mid \frac{u^3}{24} \mid \frac{u^4}{6} + \frac{u^5}{24} \\ \frac{u}{20} \mid \frac{u^2}{24} \mid \frac{u^3}{24} + \frac{u^4}{24} \mid \frac{u^5}{120} \end{vmatrix} \text{ for } | = 0, 1, 2 \ldots K \mid 1$$

The above coefficients may be pre-computed and stored in a memory (e.g., RAM or ROM), or generated via logical combinations of T and K, or they may be generated "on the fly". The third signal 34 generated by the fractional interpolation calculator 42 for the NCO remainder T may be computed as:

$$x(mT_{S3}) = \sum_{k=1}^{6} w((lTkT1)T_{S1}) v_T(k) \text{ where } mT_{S3} = \left(l + \frac{T}{K}\right)T_{S1}$$

The band limiting filter 36a may be selected to be an FIR filter, for example, an equiripple lowpass filter. The passband ripple may be better than ±0.5 dB. The stopband attenuation may be 50 dB. Table 2 may illustrate the passband edge, −3 dB frequency, and lower stopband edge of the filters:

TABLE 2

| First Sample Rate $F_{s1}$ (KHz) | Passband (−0.5 dB) | −3 dB Frequency (KHz) | Stopband (−50 dB) (KHz) |
|---|---|---|---|
| 16 | 6.5 | 6.8 | 8 |
| 22.05 | 8.7 | 9.2 | 11 |
| 24 | 9.7 | 10.2 | 12 |
| 32 | 13 | 13.6 | 16 |
| 44.1 | 14.8 | 15.7 | 19.5 |
| 48 | 14.8 | 15.7 | 19.5 |

A single set of filter coefficients may not be suitable for all sample rates because the ratio of cut-off frequency and sample rate may vary. Three sets of filter coefficients may be more suitable: one for 16, 24 and 32 KHz sample rates; another for 22.05 KHz; and another for 44.1 and 48 KHz.

Table 3 may illustrate parameters for the differentiator (comb) stages 76. Three stages (N=3) may be selected. Three stages may attenuate aliasing components by more than 60 dB, and provide passband distortion of less than 0.35 dB.

TABLE 3

| Parameter | Value |
|---|---|
| Input data rate (third sample rate) | 75, 112.5, 150, 225 KHz |
| Input data width | 12 bits |
| Output data rate | 75, 112.5, 150, 225 KHz |
| Output data width (WD3) | 14 bits |
| Register width stage 1 (WD1) | 13 bits |
| Register width stage 2 (WD2) | 14 bits |
| Register width stage 3 (WD3) | 14 bits |

Table 4 may illustrate general parameters for the zeros insertion section 72 of the CIC filter 28a. The ratio $R_{CIC}$ may vary according to the third sample rate.

TABLE 4

| Parameter | Value |
|---|---|
| Input data rate (third sample rate) | 75, 112.5, 150, 225 KHz |
| Input data width (WD3) | 14 bits |
| Output data rate (second sample rate) | 27 MHz |
| Output data width | 14 bits |

The modulo counter 82 of the zeros insertion section 72 may be a 9-bit counter. The modulo counter may count from a reset value (e.g., S) upwards. When the counter 82 may overflow (e.g., when reaching the count value of 512), the counter 82 may be reset to the reset value S, and the next sample 56 may be transferred. For any other counter value, a zero 80 may be transferred. The reset value S may depend on the third sample rate, as illustrated in table 5. The reset value S may be selectable or programmable to implement the different integer ratio conversions.

TABLE 5

| First Sample Rate $F_{s1}$ (KHz) | Third Sample Rate $F_{s3}$ (KHz) | Ratio $R_{CIC}$ | Counter Reset Value S |
|---|---|---|---|
| 16 | 75.0 | 360:1 | 152 |
| 22.05 | 112.5 | 240:1 | 272 |

TABLE 5-continued

| First Sample Rate $F_{s1}$ (KHz) | Third Sample Rate $F_{s3}$ (KHz) | Ratio $R_{CIC}$ | Counter Reset Value S |
|---|---|---|---|
| 24 | 112.5 | 240:1 | 272 |
| 32 | 150.0 | 180:1 | 332 |
| 44.1 | 225.0 | 120:1 | 392 |
| 48 | 225.0 | 120:1 | 392 |

Table 6 may illustrate parameters for the integrator stages 78. As mentioned above, the number of integrator stages 8 may be 3 (N=3).

TABLE 6

| Parameter | Value |
|---|---|
| Input data rate | 27 MHz |
| Input data width | 14 bits |
| Output data rate (second sample rate) | 27 MHz |
| Output data width (WIF) | 12 bits |
| Register width stage 1 (WI1) | 16 bits |
| Register width stage 2 (WI2) | 24 bits |
| Register width stage 3 (WI3) | 31 bits |

The data formatter 86 may be configured to round the data from the third integrator stage 78 to only 12 bits. Selection of appropriate significant bits may depend on the third sample rate, and the ratio $R_{CIC}$.

Based on a CMOS 0.18 μm technology, the above specific implementation for a high quality sample rate converter may occupy about 7635 logic gates, and have a power consumption of about 4.45 mW. In contrast, an IIR based conventional sample rate conversion circuit of comparable performance may occupy 29690 gates, and have a power consumption of about 32.25 mW. Therefore, the specific implementation according to the second embodiment may occupy only about 25% of the area previously occupied by a conventional circuit. Furthermore, the power consumption may be reduced to only about 14% of the conventional circuit. Such savings in die area and power consumption may be extremely advantageous and significant. By way of further comparison, a circuit of equivalent performance may not be practically feasible based on a conventional FIR sample rate conversion circuit, because the number of gates would be over 1000 times higher than using the second embodiment as described above.

Figure 8:
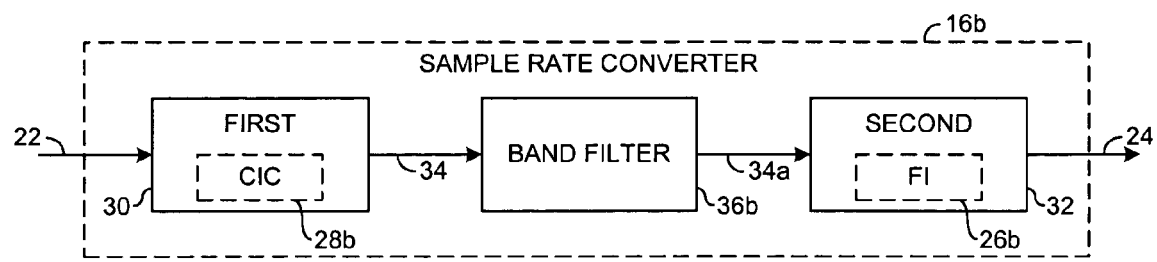
FIG. 8 is a schematic block diagram of a sample rate down-converter of a third embodiment.

Referring to FIG. 8, the third embodiment may illustrate an example of a sample rate converter used for down-conversion. The first circuit 30 may be a CIC filter 28b. The second circuit 32 may be a fractional interpolator 26b. A band-limiting filter 36b may be coupled between the CIC filter 28b and the fractional interpolator 26b to eliminate aliasing effects. The principles of the third embodiment may be very similar to those of the second embodiment, but in an opposite sequence to effect down-conversion of the sample rate, instead of up-conversion as in the second embodiment. The same principles and design considerations apply in exactly the same way to the third embodiment.

Figure 9:
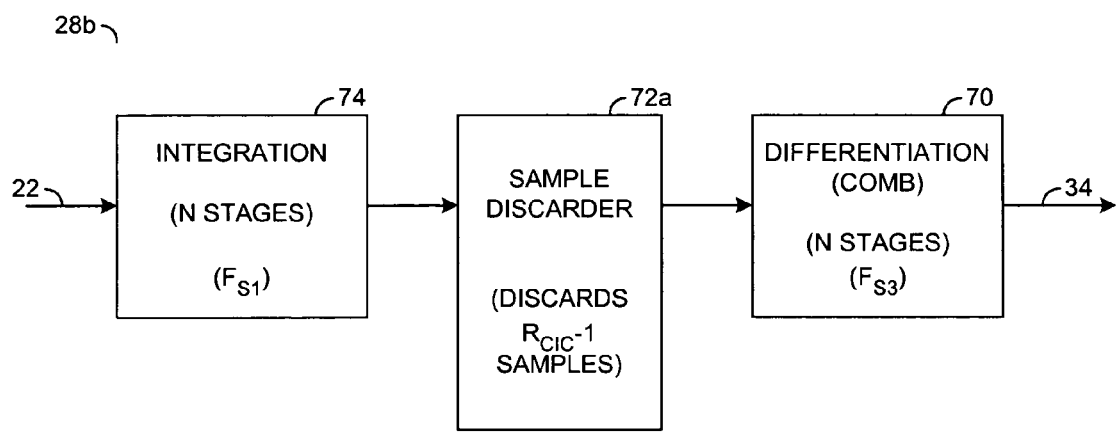
FIG. 9 is a schematic block diagram of the cascaded integrator-comb filter of the third embodiment.

FIG. 9 may illustrate the re-ordering of the sections 70-74 of the CIC filter 28b for down-sampling, compared to the arrangement of FIG. 6 for up-sampling. The same design considerations of the CIC filter 28 described for the second embodiment may also apply to the third embodiment. For down-sampling, the order of the differentiation section 70 and the integration section 74 may be swapped compared to FIG. 6. The zeros insertion section 72 of the second embodiment may be replaced by a sample-discarding section 72a. The sample-discarding section 72a may be constitute a sample-number adjusting section that may operate to discard $R_{CIC}$-1 samples to reduce the number of samples to match the third sample rate. The operation of the sample-discarding section 72a may effectively be a reverse of the insertion operation depicted in FIG. 7. For down-sampling (FIG. 9), the integration section 74 may operate at the first sample rate $F_{S1}$ and the differentiation section 70 may operate at the third sample rate $F_{S3}$.

While the invention has been particularly shown and described with reference to the preferred embodiment thereof, it will be understood by those skilled in the art that various changes in form and details may be made without departing from the spirit and scope of the invention.

The invention claimed is:

1. A circuit for converting a first digital signal having a first sample rate to second digital signal having a second sample rate, comprising:
   at least two cascaded integration-comb filters; and
   at least two fractional sample rate converters for performing fractional sample rate conversion;
   wherein:
   a first of said cascaded integrator-comb filters and a first of said fractional sample rate converters is configured to receive said first signal having said first sample rate and to generate a third digital signal having a third sample rate different from said first and second sample rates; and
   a second of said cascaded integrator-comb filters and a second of said fractional sample rate converters is configured to receive said third signal having said third sample rate and to generate said second signal having said second sample rate.

2. The circuit according to claim 1, wherein said fractional sample rate converter comprises a fractional interpolator.

3. The circuit according to claim 2, wherein said fractional interpolator comprises a numeric controlled oscillator, and a fractional interpolation calculator configured to calculate interpolated sample values based on a timing signal from said numeric controlled oscillator.

4. The circuit according to claim 1, wherein said cascaded integrator-comb filter comprises a differentiation section, an integration section, and a sample-number adjusting section coupled on a signal path between said differentiation section and said integration section.

5. The circuit according to claim 4, wherein said differentiation section comprises N differentiator stages and said integration section comprises N integrator stages, N being an integer greater than zero.

6. The circuit according to claim 1, wherein said third sample rate is intermediate said first sample rate and said second sample rate.

7. The circuit according to claim 1, wherein said third sample rate is closer to a lower of said first and second sample rates than to a higher of said first and second sample rates.

8. The circuit according to claim 1, wherein said second sample rate is higher than said first sample rate, and said first of said cascaded integrator-comb filter and said fractional sample rate converter is said fractional sample rate converter.

9. The circuit according to claim 1, wherein said first sample rate is higher than said second sample rate, and said first of said cascaded integrator-comb filter and said fractional sample rate converter is said cascaded integrator-comb filter.

10. The circuit according to claim 1, further comprising a band limiting filter coupled between said cascaded integrator-comb filter and said fractional sample rate converter.

11. The circuit according to claim 10, wherein said band limiting filter has a low-pass characteristic for attenuating frequency components higher than about one half of said first sample rate.

12. The circuit according to claim 1, wherein a sample rate conversion ratio of said cascaded integrator-comb filter is an integer ratio.

13. The circuit according to claim 12, wherein said integer ratio is an integer value or 1 divided by an integer value.

14. The circuit according to claim 12, wherein said sample rate conversion ratio of said cascaded integrator-comb filter is greater than 100.

15. The circuit according to claim 1, wherein a first sample rate conversion ratio of said fractional sample rate converter is a non-integer ratio.

16. The circuit according to claim 15, wherein said first sample rate conversion ratio is smaller than a second sample rate conversion ratio of said cascaded integrator-comb filter.

17. The circuit according to claim 1, wherein said first sample rate is less than 100 KHz, and wherein said second sample rate is greater than 10 MHz.

18. The circuit according to claim 1, wherein said circuit is formed in an integrated circuit.

19. A method of converting a first digital signal having a first sample rate to a second digital signal having a second sample rate, comprising the steps of:
   (A) generating a third signal from said first signal by using a first of a plurality of cascaded integration-comb filters and a first of a plurality of fractional sample rate converters, said third signal having a third sample rate different from said first and second sample rates; and
   (B) generating said second signal from said third signal by using a second of said plurality of cascaded integration-comb filters and a second of said plurality of said fractional sample rate converters.

20. A circuit for converting a first digital signal having a first sample rate to a second digital signal having a second sample rate, comprising:
   means for generating a third signal from said first signal by using a first cascaded integration-comb filter and a first fractional sample rate converter, said third signal having a third sample rate different from said first and second sample rates; and
   means for generating said second signal from said third signal by using a second cascaded integration-comb filter and a second fractional sample rate converter.

* * * * *